United States Patent
Liu et al.

(10) Patent No.: US 9,790,582 B2
(45) Date of Patent: Oct. 17, 2017

(54) LONG LIFETIME THERMAL SPRAY COATING FOR ETCHING OR DEPOSITION CHAMBER APPLICATION

(71) Applicant: Lam Research Corporation, Fremont, CA (US)

(72) Inventors: Chin-Yi Liu, San Jose, CA (US); Russell Ormond, San Jose, CA (US); Nash W. Anderson, Mountain View, CA (US); David M. Schaefer, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/697,454

(22) Filed: Apr. 27, 2015

(65) Prior Publication Data
US 2016/0312351 A1 Oct. 27, 2016

(51) Int. Cl.
| | |
|---|---|
| B32B 15/04 | (2006.01) |
| C23C 4/134 | (2016.01) |
| H01L 21/66 | (2006.01) |
| H01L 21/67 | (2006.01) |
| C23C 4/11 | (2016.01) |

(Continued)

(52) U.S. Cl.
CPC ............. *C23C 4/134* (2016.01); *C23C 4/06* (2013.01); *C23C 4/11* (2016.01); *H01J 37/3299* (2013.01); *H01J 37/32477* (2013.01); *H01J 37/32495* (2013.01); *H01J 37/32972* (2013.01); *H01L 21/67069* (2013.01); *H01L 21/67253* (2013.01); *H01L 22/10* (2013.01)

(58) Field of Classification Search
CPC .................... Y10T 29/49; Y10T 29/49002
See application file for complete search history.

(56) References Cited

U.S. PATENT DOCUMENTS

| | | | |
|---|---|---|---|
| 6,942,929 B2 | 9/2005 | Han et al. | |
| 8,293,335 B2 | 10/2012 | Chang | |

(Continued)

FOREIGN PATENT DOCUMENTS

| | | |
|---|---|---|
| EP | 1 249 515 A2 | 10/2002 |
| WO | 2014/190211 | 11/2014 |
| WO | 2014/205212 | 12/2014 |

OTHER PUBLICATIONS

Hong Shih, "A Systematic Study and Characterization of Advanced Corrosion Resistance Materials and Their Applications for Plasma Etching Processes in Semiconductor Silicon Wafer Fabrication", Corrosion Resistance, Dr Shih (Ed.), ISBN: 978-953-51-0467-4, InTech, DOI: 10.5772/31992. Available from: http://www.intechopen.com/books/corrosion-resistance/a-systematic-study-and-characterization-of-advanced-corrosion-resistance-materials-and-their-applica ; 35 pages.

(Continued)

*Primary Examiner* — Zandra Smith
*Assistant Examiner* — Andre' C Stevenson
(74) *Attorney, Agent, or Firm* — Beyer Law Group LLP

(57) ABSTRACT

In accordance with this disclosure, there are provided several inventions, including a substrate processing apparatus with multi-layer surfaces configured to face the plasma and resist against corrosion. These multi-layer surfaces may in one example include a base layer of aluminum, anodized aluminum, or quartz, a second layer of stabilized zirconia, and a second layer of a yttrium-aluminum composite such as yttrium aluminum garnet (YAG).

16 Claims, 4 Drawing Sheets

(51) Int. Cl.
C23C 4/06 (2016.01)
H01J 37/32 (2006.01)

(56) References Cited

U.S. PATENT DOCUMENTS

| | | |
|---|---|---|
| 8,619,406 B2 | 12/2013 | Cho et al. |
| 9,394,615 B2* | 7/2016 | Sun .......................... C23F 1/08 |
| 2005/0041238 A1 | 2/2005 | Ludviksson et al. |
| 2008/0169588 A1 | 7/2008 | Shih et al. |
| 2008/0264565 A1 | 10/2008 | Sun et al. |
| 2010/0055479 A1* | 3/2010 | Beardsley ................. C23C 4/06 |
| | | 428/457 |
| 2012/0273130 A1 | 11/2012 | Drewery et al. |
| 2013/0214153 A1* | 8/2013 | Morrisroe ............. F23C 99/003 |
| | | 250/288 |
| 2013/0327480 A1* | 12/2013 | Carducci ............. H01J 37/3244 |
| | | 156/345.1 |
| 2014/0113453 A1 | 4/2014 | Shih et al. |
| 2014/0272459 A1 | 9/2014 | Daugherty et al. |
| 2014/0295670 A1 | 10/2014 | Shih et al. |
| 2015/0075714 A1 | 3/2015 | Sun et al. |

OTHER PUBLICATIONS

Y J Su et al. "Thermal Conductivity Phase Stability, and Oxidation Resistance of $Y_3Al_5O_{12}$ (YAG)/$Y_2O_3$—$ZrO_2$ (YSZ) Thermal-Barrier Coatings", Oxidation of Metals, vol. 61, No. 3/4, Apr. 2004.
European Search Report dated Sep. 1, 2016 from European Application No. 16165058.

* cited by examiner

LONG LIFETIME THERMAL SPRAY COATING FOR ETCHING OR DEPOSITION CHAMBER APPLICATION

BACKGROUND

The present invention relates to the formation of coated surfaces which may be used in semiconductor processing.

In semiconductor material processing facilities, plasma processing chambers are often used, for example, for etching and deposition. The walls of these chambers, as well as liners, process kits, and dielectric windows, are often exposed to corrosive and erosive process gases, as well as plasma. Therefore, plasma chambers, typically composed of aluminum, are sometimes coated with protective layers to increase the life of the chamber.

U.S. Pat. No. 8,619,406 B2 describes a coating of is yttrium oxide (yttria, $Y_2O_3$), which has been applied directly to aluminum or with an intermediary layer of aluminum oxide. An improvement over yttria is yttria-stabilized zirconia (YSZ, $ZrO_2{:}Y_2O_3$). It is also possible to layer either of these components with other components. For example, U.S. Pat. No. 6,942,929 describes a coating of yttrium aluminum garnet (YAG, $Y_3Al_5O_{12}$) over aluminum. U.S. Patent Pub. No. 2008/0169588 A1 describes a coating in which there is an outer layer of yttria and an intermediate layer of YAG, above a third layer of alumina. Another example is U.S. Patent Pub. No. 2014/0295670 A1, which describes a coating of yttria over aluminum oxide, over aluminum or aluminum alloy.

Given the expense and lost time in shutting down plasma processing chambers after they wear out, there is an interest in chamber coatings that have longer lifetimes, and which may have better protection against corrosive process chemicals.

SUMMARY

Various inventive embodiments are described herein. One embodiment is a substrate processing apparatus comprising a chamber configured to contain a plasma, wherein the apparatus may comprise one or more multi-layer surfaces oriented to face the plasma, the one or more multi-layer surfaces may each comprise: a base material; a first layer over the base material comprising zirconia stabilized with a dopant oxide; and a second layer over the first layer, comprising a yttrium-aluminum composite.

In another embodiment, at least one of the one or more multi-layer surfaces may be a transparent quartz window. The embodiment may further comprise: a spectrometric sensor positioned to take spectrometric measurements inside the chamber, through the quartz window; an analog to digital converter configured to convert signals corresponding to the spectrometric measurements into one or more digital signals; and a general purpose computer, which may comprise: one or more processors; a digital memory system; and an I/O bus in communication with the analog to digital converter and configured to receive the one or more digital signals; and one or more interconnection busses configured to transmit data between the one or more processors, the data receiver, the digital memory system, and the I/O bus.

In another embodiment, a method of operating the above apparatus or related apparatuses disclosed herein may comprise: using the spectrometric sensor to repeatedly take spectrometric measurements of the level of zirconium within the chamber, through the quartz window, wherein the spectrometric measurements are converted into the one or more digital signals by the analog to digital converter and transmitted to the I/O bus of the general purpose computer; causing the general purpose computer to run computer executable program instructions comprising instructions to monitor the digital signals until the signals reflect a spike in the level of zirconium in the chamber, and then to transmit a signal indicating the failure of a coating on a surface within the apparatus.

In another embodiment, a method of making any of the above apparatuses or related apparatuses disclosed herein may comprise, for each surface of the one or more surfaces: providing the base material; forming the first layer over the base material by exposing the surface to a plasma thermal spray; and after the first layer is formed, forming the second layer over the first layer by exposing the surface to a plasma thermal spray.

These and other features of the present inventions will be described below in the detailed description and in conjunction with the following figures.

BRIEF DESCRIPTION OF THE DRAWINGS

The disclosed inventions are illustrated by way of example, and not by way of limitation, in the figures of the accompanying drawings and in which like reference numerals refer to similar elements and in which.

DETAILED DESCRIPTION

Inventions will now be described in detail with reference to a few of the embodiments thereof as illustrated in the accompanying drawings. In the following description, specific details are set forth in order to provide a thorough understanding of the present invention. However, the present invention may be practiced without some or all of these specific details, and the disclosure encompasses modifications which may be made in accordance with the knowledge generally available within this field of technology. Well-known process steps and/or structures have not been described in detail in order to not unnecessarily obscure the present disclosure.

In plasma process chambers with a particular prior art coating of yttrium oxide, the inventors have observed an average lifetime of 3700 RF hours. This failure can be much earlier, depending on the chemistry of the plasma process. Failure mechanisms for such coatings may include delamination during the cleaning process upon, for example, exposure to chlorine or fluorine. The inventors have observed, however, that a coating of YSZ over aluminum may last approximately 10 times longer than a $Y_2O_3$ coating in the test involving HF solution to mimic fluorine plasma exposure in a reactor. However, in a similar test involving an HCl solution to mimic chlorine plasma exposure in a reactor, there is minimal improvement in the lifetime of the coating. A coating of YAG over aluminum may last approximately 6 times longer than the $Y_2O_3$ coating in a test involving HCl solution to mimic chlorine plasma exposure in a reactor, but a similar test involving HF solution only approximately doubles the lifetime with respect to $Y_2O_3$. Thermal cycling does not appear to substantially affect these results. The inventors have determined that there are advantages to combining the benefits of YAG with the benefits of YSZ in a single coating which, among its other benefits, would be resistant to both HCl and HF.

Figure 1:
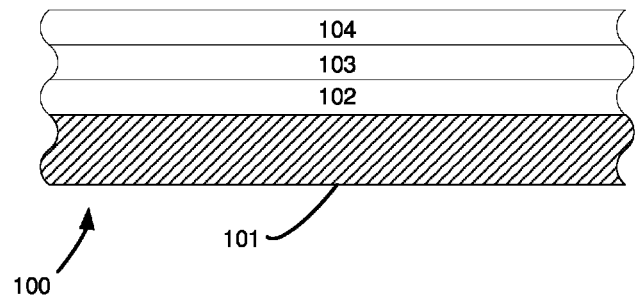
FIG. 1 is a schematic cross-sectional view of a multi-layer coating.

FIG. 1 shows one embodiment of such a coating 100 that combines the advantages of YSZ and YAG in the same coating. In this example, aluminum is the base/bulk material to be coated 101, which is an interior surface of a plasma chamber. Above the aluminum is a layer of $Al_2O_3$ 102. Above that is a layer of YSZ 103. Finally, on the top is a layer of YAG 104. The YAG layer 104 in this example is facing the plasma side of a chamber.

In other embodiments, zirconia may be stabilized with other oxides than yttria in layer 103, such as magnesia (MgO), calcium oxide (CaO), and cerium(III) oxide ($Ce_2O_3$), iridium(IV) oxide ($IrO_2$), titanium(IV) oxide ($TiO_2$), or oxides of elements from atomic numbers 57 (La) to 71 (Lu). In another embodiment, the $Al_2O_3$ layer 102 may be omitted. Also, other embodiments may include other yttrium-aluminum composites, such as yttrium aluminum monoclinic (YAM) and yttrium aluminum perovskite (YAP). In some cases, coatings of YAG may contain small amounts of other components such as YAP and/or YAM, while still considered to be YAG.

In other embodiments, there may be intermediate layers of other materials, or multiple layers of any of the above materials, arranged in any order. Various plasma processing chamber base materials 101 may be used, including aluminum (Al), aluminum oxide ($Al_2O_3$), an $Al_2O_3$ film on Al (created, for example, by anodization), a non-aluminum containing metal, quartz, or other known plasma chamber materials.

The layers of the coating 103 and 104 may, in one embodiment, be applied by plasma thermal spraying. In other embodiments, they may be applied by sputtering, plasma enhanced chemical vapor deposition or other chemical vapor deposition, electron beam physical vapor deposition or other physical vapor deposition, chemical solution deposition, atomic layer deposition, pulse laser deposition, cathodic arc deposition, electrohydrodynamic deposition, sol-gel precursor deposition, aerosol deposition, and the like.

In one embodiment, the total thickness of layers 103 and 104 is about 0.2 mm (8 mils). The total thickness of the layers may be more or less; however, there is a trade-off relating to the thickness of the layers. The thicker the layers, the greater the corrosion resistance and lifetime of the coating is likely to be. However, as the layer gets thicker, the adhesion to the underlying layer(s) may decrease. Thus, a thinner layer may be better, assuming the surface can be coated uniformly. In one embodiment, layer 103 can be approximately 0.05-0.1 mm (2-4 mils) thick, and layer 104 can be approximately 0.05-0.15 mm (2-6 mils) thick.

Surfaces, as described, may in one embodiment be configured to withstand a lifetime of approximately 6,000 to 10,000 RF hours before failure, or in another embodiment, higher than 10,000 RF hours. The surfaces may also be designed to fail within a given expected range, such as 6,000 to 8,000 RF hours, 7,000 to 9,000 RF hours, or 8,000 to 10,000 RF hours.

The chamber may be configured in various ways known in the art. Suitable chambers may include 2300® Versys® Kiyo45™ chambers provided by Lam Research Corporation, or the like. The surfaces may be formed by any method known in the art. In addition, in one embodiment, both an intermediate zirconium-containing layer and an outer yttrium-aluminum composite layer may be deposited by plasma thermal spray. In one embodiment, the interior of plasma chamber composed of aluminum and/or one or more quartz windows may be coated by plasma thermal spray, to produce at least two coatings.

Figure 2:
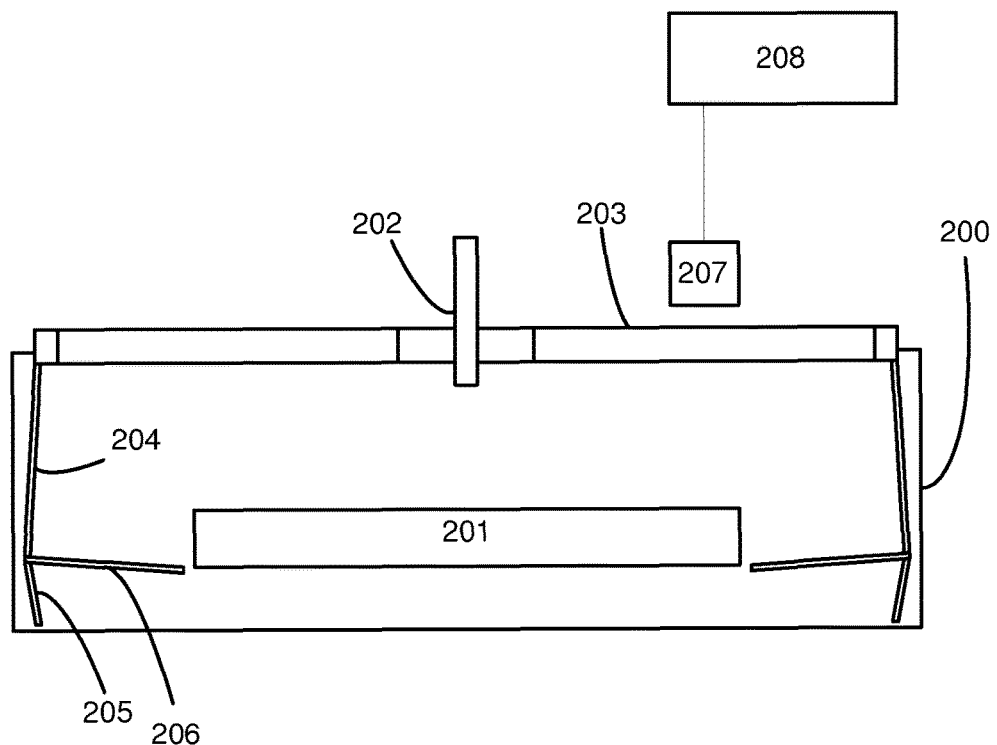
FIG. 2 is a schematic view of a processing chamber that may be used in practicing the disclosed inventions.

In another embodiment, a plasma chamber may comprise one or more replaceable linings. These linings may be coated in a controlled environment, and then inserted into the plasma chamber. FIG. 2 is a schematic, simplified view of an embodiment of a plasma processing chamber showing replaceable coated liners. Inside the chamber 200, a chuck 201 may be used for holding substrates. An injector 202 may be used to inject process gasses into the chamber. Liners 204, 205, and 206 may be used in any configuration to protect the chamber from corrosion. Such liners may be made of any suitable material. In one embodiment, the liners may be composed of aluminum, and coated in accordance with one of the coatings described herein.

The embodiment of FIG. 2 includes a quartz window 203, which may also be coated as described herein, with the coating facing the plasma-side of the chamber. In one embodiment, a sensor 207 may be placed behind the quartz window, and connected via sensor circuitry to a processor 208 for processing signals from the sensor 207.

In one embodiment, the failure of a surface coated as described herein may be recognized by the use of sensors to monitor the presence of zirconium in the chamber. In a configuration where zirconium is only a component within an intermediate layer, zirconium may thus serve as a signal that layers above the zirconium layer have been breached. In one example, a zirconium spike may be recognized in the plasma, or on the surface of a substrate being processed. Such a spike may indicate, for example, that there has been a significant corrosion through an outer YAG layer and that an intermediate YSZ layer is being corroded. This could therefore result in a marked increase in the measured zirconium level. A spike may be recognized in several ways, including by setting a predetermined threshold for zirconium concentration in the chamber, such that when the threshold is met, this may be an indication that a surface coating within the chamber has failed. In an alternate embodiment, a threshold can be set for the rate of change in zirconium concentration as a function of time.

When a coating in the interior of a chamber fails, the chamber may be replaced or re-coated, or a part of the chamber may be replaced or re-coated. In one embodiment, the chamber may contain replaceable coated liners, and when the coating on one of the liners fails, the liner may be replaced. In another embodiment, a quartz window insert may similarly be coated, and the window replaced when the coating fails. In another embodiment, a gas injector into the chamber may be coated as described above, and when the coating on the gas injector fails, the injector may be replaced.

Figure 3:
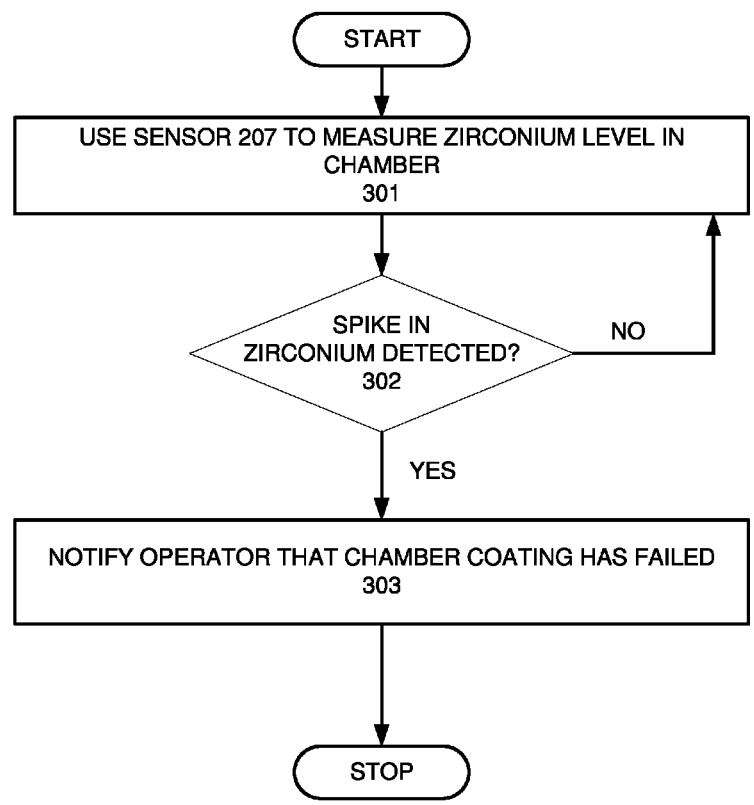
FIG. 3 is a flowchart illustrating a process for creating a multi-layer coating.

FIG. 3 shows an embodiment of an algorithm for determining when a surface inside a chamber, and in particular a replaceable liner surface, has failed. In step 301, sensor 207 may be used to measure the zirconium level in the chamber. The process loops (302) so long as a spike in the zirconium level has not been detected. If a spike is detected, however, the process may indicate to an operator that a chamber coating has failed, 303. An operator may in one embodiment respond by stopping the process, inspecting the liners, and replacing all the liners, or just the liner or liners that have failed. The algorithm may be performed by analog alarm circuitry as known in the art, or by digital circuitry such as a special- or general-purpose computer. An operator may be notified by various means, including a visual display, an audible alarm, or a text message. Such notifications can, in one embodiment, be sent over a wired or wireless network or otherwise via any appropriate telecommunications medium.

Figure 4:
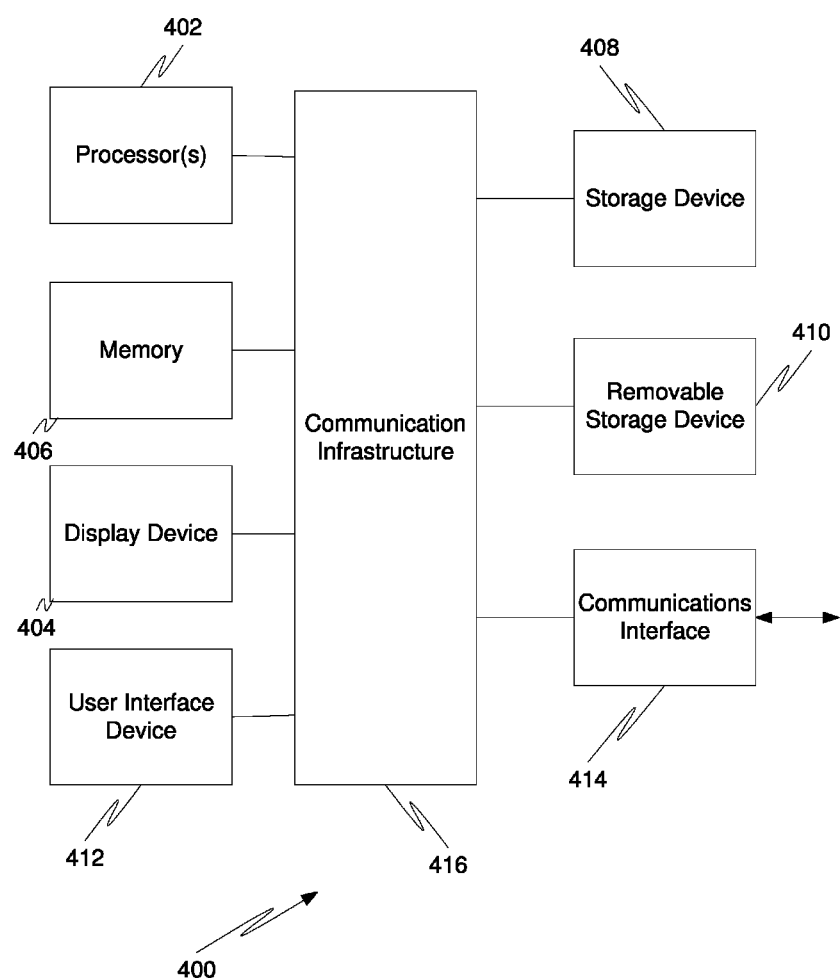
FIG. 4 is a schematic illustration of a computer system for implementing a sensor processing system used in embodiments of the disclosed inventions.

FIG. 4 is a high level block diagram illustrating a computer system 400 for implementing a sensor processing system used in embodiments of the disclosed inventions. The computer system may have many physical forms ranging from an integrated circuit, a printed circuit board, and a small handheld device up to a huge super computer. The computer system 400 may include one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and/or a communication interface 414 (e.g., wireless network interface). The communication interface 414 may allow software and/or data to be transferred between the computer system 400 and external devices via a link. The system may also include a communications infrastructure 416 (e.g., a communications bus, cross-over bar, or network) to which the aforementioned devices/modules may be connected.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

The computer device 400 may serve as the processor 208 for processing signals from the sensor 207 in FIG. 2. For example, signals from sensor 207 may be processed through an analog-to-digital computer, such that a digital signal may be transmitted to the computing device 208, for example via the communications interface 414, which may include an I/O bus.

While inventions have been described in terms of several preferred embodiments, there are alterations, permutations, and various substitute equivalents, which fall within the scope of this invention. There are many alternative ways of implementing the methods and apparatuses disclosed herein. It is therefore intended that the following appended claims be interpreted as including all such alterations, permutations, and various substitute equivalents as fall within the true spirit and scope of the present invention.

What is claimed is:

1. A substrate processing apparatus comprising a chamber configured to contain a plasma, wherein the apparatus comprises one or more multi-layer surfaces oriented to face the plasma, the one or more multi-layer surfaces each comprising:
a base material;
a first layer over the base material consisting essentially of zirconia stabilized with a dopant oxide; and
a second layer over the first layer, comprising a yttrium-aluminum composite.

2. The apparatus of claim 1, wherein the yttrium-aluminum composite is yttrium aluminum garnet (YAG).

3. The apparatus of claim 1, wherein the yttrium-aluminum composite is yttrium aluminum monoclinic (YAM) and yttrium aluminum perovskite (YAP).

4. The apparatus of claim 1, wherein the first layer is yttria stabilized zirconia (YSZ).

5. The apparatus of claim 1, wherein the base material is metallic aluminum or aluminum alloy.

6. The apparatus of claim 5, further comprising a third layer above the base material and below the first layer comprising aluminum oxide.

7. The apparatus of claim 1, wherein the base material is quartz.

8. The apparatus of claim 1, wherein the first layer has a thickness of at least about 0.05 mm and no greater than about 0.1 mm, and wherein the second layer has a thickness of at least about 0.05 mm and no greater than about 0.15 mm.

9. The apparatus of claim 1, wherein the total thickness of the first layer and the second layer is less than about 0.2 mm.

10. The apparatus of claim 1, wherein at least one of the one or more multi-layer surfaces is a replaceable chamber liner configured to fit within the chamber to face the plasma, such that it may be removed from the chamber and replaced with an identical chamber liner to refurbish the apparatus.

11. The apparatus of claim 1, wherein at least one of the one or more multi-layer surfaces is a transparent quartz window.

12. The apparatus of claim 11, further comprising:
a spectrometric sensor positioned to take spectrometric measurements inside the chamber, through the quartz window;
an analog to digital converter configured to convert signals corresponding to the spectrometric measurements into one or more digital signals; and
a general purpose computer comprising:
one or more processors;
a digital memory system; and
an I/O bus in communication with the analog to digital converter and configured to receive the one or more digital signals; and
one or more interconnection busses configured to transmit data between the one or more processors, the data receiver, the digital memory system, and the I/O bus.

13. The apparatus of claim 12, wherein the digital memory system is loaded with executable program instructions comprising instructions to repeatedly cycle through a set of steps, the steps in the cycle comprising:
(1) receiving a digital signal from among the one or more digital signals from the analog to digital converter, wherein the signal is a number reflecting a spectrometric measurement of the level of zirconium within the chamber;

(2) comparing the number to a threshold number representing the maximum the level of zirconium reflecting a failure of one or more surfaces in the chamber;

(3) if the number equals and/or exceeds the threshold number, ending the cycle and transmitting a signal indicating the failure of a coating on a surface within the apparatus; otherwise, repeating the cycle.

14. A method of operating the apparatus of claim 12, comprising:

using the spectrometric sensor to repeatedly take spectrometric measurements of the level of zirconium within the chamber, through the quartz window, wherein the spectrometric measurements are converted into the one or more digital signals by the analog to digital converter and transmitted to the I/O bus of the general purpose computer;

causing the general purpose computer to run computer executable program instructions comprising instructions to monitor the digital signals until the signals reflect a spike in the level of zirconium in the chamber, and then to transmit a signal indicating the failure of a coating on a surface within the apparatus.

15. A method of making an apparatus as recited in claim 1, comprising, for each surface of the one or more surfaces:

providing the base material;

forming the first layer over the base material by exposing the surface to a plasma thermal spray; and after the first layer is formed, forming the second layer over the first layer by exposing the surface to a plasma thermal spray.

16. The apparatus of claim 1, wherein the second layer consists essentially of the yttrium-aluminum composite.

* * * * *